(12) United States Patent
Coehlo et al.

(10) Patent No.: US 6,223,272 B1
(45) Date of Patent: Apr. 24, 2001

(54) TEST VECTOR VERIFICATION SYSTEM

(75) Inventors: Paul R. Coehlo, Sunnyvale; Manuel O. Gautho, San Jose; Yeh-Chen Fu, Sunnyvale, all of CA (US)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/116,062

(22) Filed: Jul. 15, 1998

(51) Int. Cl.[7] ....................................................... G06F 11/00
(52) U.S. Cl. ................................................ 712/1; 703/21
(58) Field of Search ..................... 712/1; 717/4; 703/13, 703/14, 15, 20, 21

(56) References Cited

U.S. PATENT DOCUMENTS

| | | | |
|---|---|---|---|
| 5,177,630 | 1/1993 | Goutzoulis et al. | 359/135 |
| 5,377,197 | 12/1994 | Patel et al. | 714/724 |
| 5,528,602 | * 6/1996 | West | 371/22.4 |
| 5,572,664 | 11/1996 | Bujanos | 714/25 |
| 5,832,235 | * 11/1998 | Wilkes | 709/247 |
| 5,878,050 | * 3/1999 | Brahme | 371/21.2 |
| 5,963,736 | * 10/1999 | Sarno | 703/27 |

OTHER PUBLICATIONS

Dictionary of Computers Information Processing & Telecommunications 2nd Ed. by Jerry M. Rosenberg, John Wiley & Sons Pub. p. 205, 1987.*

* cited by examiner

Primary Examiner—Eric Coleman

(57) ABSTRACT

The present invention relates to a verification system for verifying whether vector outputs from a software simulator match the vector outputs from a hardware emulator by comparing a pair of checksums. A first checksum value is calculated from the output vectors obtained from the software simulator and a second checksum is calculated from the output vectors obtained from the hardware emulator. Accordingly, only a checksum value is required to be downloaded or uploaded, thereby eliminating the need to upload or download large numbers of output vectors. The system includes a software simulator for generating a set of input and output vectors, a checksum calculator for calculating the checksum of the output vector generated by the software simulator, a hardware emulator for receiving and storing the vector inputs and the checksum value generated by the software simulator and for generating output vectors based on the downloaded input vectors, a checksum calculator for calculating the checksum of the vector outputs generated by the hardware emulator and a checksum comparator for comparing the checksums.

21 Claims, 3 Drawing Sheets

```
// crc16 function
// take 8-bits input and old crc, (initialkly CRC = 0xffff)
// generate new crc upon them unsigned crc_ccitt (unsigned CRC, unsigned input)
{
    for (i = 0; i<16; i++)
        crc_o[i] = (crc >>i) & 0x1 ;

for (i = 0; i <; i++)
        data [i] = (input >>i) & 0x1 ;

crc_n[0]  = crc_o[8]  ^ crc_o[12]  ^ data[3]  ^data[7] ;
    crc_n[1]  = crc_o[9]  ^ crc_o[13]  ^ data[2]  ^data[6] ;
    crc_n[2]  = crc_o[10] ^ crc_o[14]  ^ data[1]  ^data[5] ;
    crc_n[3]  = crc_o[11] ^ crc_o[15]  ^ data[0]  ^data[4] ;
    crc_n[4]  = crc_o[12] ^ data [3] ;
    crc_n[5]  = crc_o[13] ^ crc_o[12]  ^ crc_o[8]  ^data[7]  ^data[3]  ^ data[2] ;
    crc_n[6]  = crc_o[14] ^ crc_o[13]  ^ crc_o[9]  ^data[1]  ^data[2]  ^ data[6] ;
    crc_n[7]  = crc_o[15] ^ crc_o[14]  ^ crc_o[10] ^data[0]  ^data[1]  ^ data[5] ;
    crc_n[8]  = crc_o[15] ^ crc_o[11]  ^ crc_o[0]  ^data[0]  ^data[4] ;
    crc_n[9]  = crc_o[12] ^ crc_o[1]   ^ data[3] ;
    crc_n[10] = crc_o[13] ^ crc_o[2]   ^ data[2] ;
    crc_n[11] = crc_o[14] ^ crc_o[3]   ^ data[1] ;
    crc_n[12] = crc_o[15] ^ crc_o[12]  ^ crc_o[8]
  ^crc_o[4] ^ data[0] ^data[3] ^ data[7] ;
    crc_n[13] = crc_o[13] ^ crc_o[9]   ^ crc_o[5]  ^data[2]  ^data[6] ;
    crc_n[14] = crc_o[14] ^ crc_o[10]  ^ crc_o[6]  ^data[1]  ^data[5] ;
    crc_n[15] = crc_o[15] ^ crc_o[11]  ^ crc_o[7]  ^data[0]  ^data[4] ;

CRC = 0 ;
    for (i=0; i<16; i++)
        CRC |=(( crc_n[i] & 0x1) <<i) ;
    return CRC ;
}
```

FIG. 2

TEST VECTOR VERIFICATION SYSTEM

BACKGROUND OF THE INVENTION

1. Field of the Invention

The present invention relates generally to regression testing and, more particularly, to a vector verifications system for increasing the speed at which regression tests may be executed.

2. Description of the Prior Art

Modern electronic hardware design of circuit boards and microprocessors, including microcontrollers and application specific integrated circuits (ASIC), oftentimes necessitates the use of software simulation and/or hardware emulation to verify that the hardware design being tested is functional. In particular, semiconductor companies generally must endure a long and complicated process of prototyping, testing and debugging to ensure that a designed part will work properly.

Verification testing is generally performed through regression testing wherein a large number of test vectors are run. Test vectors specify the expected functional operation of a chip or other device by defining the outputs as a function of the inputs for a certain number of clock cycles. Regression testing involves running the test vectors to exercise some functionality of the device and to determine that some functionality in the device model, which has worked at some point, continues to work as the design evolves.

As ASIC densities exceed one million gates and chip densities approach ten million transistors, design verification becomes a critical factor. Software simulation is the method that has historically been used to verify the Boolean logic of a design. Typically, software based simulators are event-driven. That is, every active signal is determined for every device it propagates through during a clock cycle. As such, software simulation is a relatively slow and inaccurate process and, used alone, is unable to capture all the intricacies of a complex chip. Cycle based simulators are also available, and provide performance gains in verifying Boolean logic. However, cycle-based simulators sacrifice functionality for performance.

Hardware emulation, unlike software emulation, allows engineers to model chip designs in hardware. This is accomplished by mapping the design onto reprogrammable circuitry. The resulting product is a functional equivalent of the actual chip that is able to function at close to real time, able to assure correct timing relationships and run real software. Thus, it can be seen that hardware emulation is faster and more accurate than software simulation. However, use of both software simulation and hardware emulation provides for generally more accurate verification than any single method alone.

Typically, in situations where software simulation and hardware emulation are both used, the software simulator is used to generate outputs based on a number of given inputs. These input vectors are then downloaded to a hardware emulator to serve as inputs, and used to generate output vectors. The output vectors from the hardware emulator are then compared with those of the software simulator. The comparison is done by either downloading the output results from the simulator to the emulator and then having the emulator compare the outputs or by uploading the output results from the hardware emulator to the software simulator and then comparing the results on the simulator. If the outputs do not match, then it can be assumed that either the hardware design or the software simulator is flawed.

Unfortunately, although increased computing power and more powerful hardware have increased the speed of execution of testing on software simulators and hardware emulators, vector comparison remains one of the greatest time consuming operations. In particular, many hardware emulation techniques spend 90% of the time required for regression testing on vector download and only 10% of the time simulating the hardware. Furthermore, oftentimes vector verification is performed manually, further increasing the amount of time vector verification takes. As each generation of the devices becomes increasingly dense, the number of transistors or gates increase, thereby increasing the number of regressions that must be run. Accordingly, this leads to an increase in the number of test vectors that must be downloaded into the hardware emulator or uploaded to the software simulator. Accordingly, comparison time for verifying the output vectors also increases. Currently, for example, running a regression on a microcontroller having fewer than one million transistors may require along the lines of 1000 tests with each test requiring 1000 one-cycle vectors and having a bit value of 1000. This results in a total of one billion bits that must be downloaded or uploaded and then verified. For very dense microprocessors, the above numbers increase dramatically.

What is needed, therefore, is a system for enabling efficient and fast comparison of output vectors in order to decrease the amount of time required to run regression tests.

SUMMARY OF THE INVENTION

Briefly, the present invention relates to a verification system for verifying whether output vectors from a software simulator match the output vectors from a hardware emulator by comparing a pair of checksum values. A first checksum value is calculated from the output vectors obtained from the software simulator and a second checksum is calculated from the output vectors obtained from the hardware emulator. Accordingly, only a checksum value is required to be downloaded or uploaded, thereby eliminating the need to upload or download large numbers of output vectors. In particular, the system includes a software simulator for generating a set of input and output test vectors, a checksum calculator for calculating the checksum of the vector outputs generated by the software simulator, a hardware emulator for receiving and storing the vector inputs and the checksum value generated by the software simulator and for generating output vectors based on the downloaded input vectors, a checksum calculator for calculating the checksum of the vector outputs generated by the hardware emulator and a checksum comparator for comparing the checksums.

BRIEF DESCRIPTION OF THE DRAWINGS

FIG. 2 is a representative software algorithm for generating a checksum in accordance with the present invention.

DETAILED DESCRIPTION OF THE INVENTION

The present invention relates to a system for quickly and accurately verifying a device design by determining whether test vector outputs from a software simulator match the test vector outputs from a hardware emulator for a logic device by comparing a checksum. High speed verification of test vector outputs is achieved by calculating a checksum based on the output vectors obtained from the software simulator, downloading the checksum and the input vectors into the hardware emulator, using the input vectors to generate output vectors in the hardware emulator, calculating the checksum of the hardware emulator output vectors and then comparing the checksum values. Accordingly, in those instances where the checksums do not match, then either the software simulator or the hardware design is flawed. Thus, an important aspect of the invention relates to eliminating the need to upload or download large numbers of output vectors.

Presently, many hardware emulation and software simulation systems require that an engineer visually check whether the output vectors match. Alternatively, a program may be written that will automatically do a vector by vector comparison. However, once again, there is a need for output vectors to be downloaded or uploaded before the verification program may be run. Thus, still another important aspect of the invention relates to reducing and/or eliminating manual verification.

Figure 1:
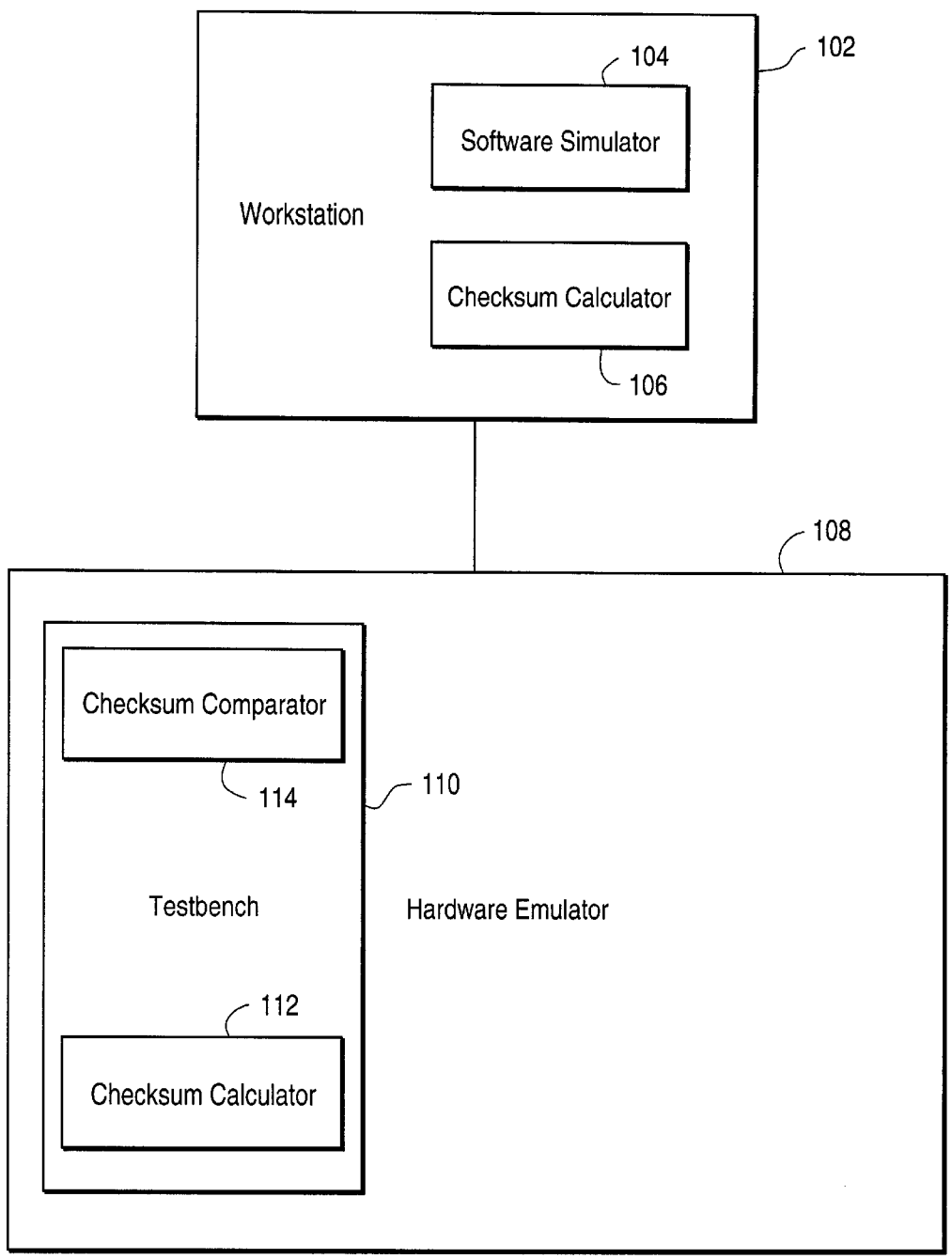
FIG. 1 is a diagram of a device verifications system for verifying the functionality of a device in accordance with the present invention.

Referring to FIG. 1, the basic verification system is illustrated according to the present invention. In particular, a data processing system 102, such as a workstation or personal computer (PC), is provided that is electrically connected to a hardware emulator 108. The workstation 102 includes a software simulator program 104 for simulating the hardware design and a checksum calculator 106 for determining the checksum value of output vectors. The hardware emulator 108 includes a downloadable testbench 110 for testing the device under test (DUT). The checksum calculator 106, which is used for calculating the checksum of the output vectors generated by the hardware emulator 108, may be programmed into the testbench 110. A checksum comparator 114 for comparing the output vector checksums may be located on either the workstation 102 or the testbench 110.

The basic data-processing system 102 may be a personal computer or workstation, such as sold by Sun Microsystems Corp. of Palo Alto, Calif. The workstation 102 is used to store and execute the software simulator program 104, such as SpeedSim, sold by Quickturn Design Systems, Inc. of San Jose, Calif. The software simulator program 104 uses a Boolean logic equivalent of the circuit of the device being developed and simulates the operation of the circuit in software. This logic circuit is known as the "golden model" and provides a system for establishing a baseline output expected from a particular input. Therefore, the output vectors obtained from other tests, such as hardware emulation, may be compared to the output vectors of the golden model to determine whether the vectors match and whether the device is operating as expected.

The workstation 102 also includes a checksum calculator 106. In particular, the checksum calculator 106 receives the output vectors from the golden model and executes a software program for calculating a checksum value based on the output vectors generated by the software simulator program 104. The checksum software program, which is shown in FIG. 2 by way of example only, may be an algorithm based on the Additive Congruential Method. It is to be noted, however, that any algorithm may be used to calculate the checksum of the output vectors. It can be seen, therefore, that the large number of output vectors may be expressed as a single checksum value.

The workstation 102 also includes software for creating the testbench 110. The testbench 110 is simply a program written in a hardware description language (HDL), such as VHDL or Verilog among others, that provides the environment in which the DUT may be exercised such as to test the functionality of the components. The testbench 110 interfaces the DUT to the hardware emulator 108. In particular, the entire testbench 110 with the DUT inserted, after being created on the workstation 102, is downloaded to the hardware emulator 108. Furthermore, the testbench 110 may also be programmed with a checksum calculator 112. This enables the hardware emulator 108 to calculate the checksum of the output vectors generated by the hardware emulator 108. The checksum calculator may be the same computer program that was used in calculating the checksum of the output vectors in the software simulator program 104.

The hardware emulator 108, which may be a field programmable gate array (FPGA)-based emulator, such as the CoBALT Emulation System sold by Quickturn Design Systems running emulation software, such as Quest II, also sold by Quickturn Design Systems, enables regression testing of the hardware design using the input vectors used in the software simulator. Upon execution of the hardware emulation, the output vectors generated by the hardware emulator 108 are processed through the checksum calculator 112 in the testbench 110. The checksum calculator 112 then generates a checksum value based on the output vectors.

The checksum comparator 114, which may be programmed within the testbench 110 compares the value of the checksum generated by the hardware emulator 108 with the checksum downloaded from the software simulator 106. The checksum comparator 114, which may be, for example, a hardware comparator or a simple HDL or C++ software programming instruction, compares the two checksum values. If the checksum values match, that is the outputs of the hardware emulator match the outputs of the golden model, then the hardware implementation may be regarded as successful.

Alternatively, instead of downloading the checksum value from the software simulator 106 to the hardware emulator 108, the checksum from the hardware emulator 108 may be uploaded to the software simulator 106 for comparison. In that case, the checksum comparator 114 would have to be located on the workstation 102. In either case, the requirement for uploading and/or downloading large numbers of output vectors for comparison is eliminated. Thus, it can be seen, that only a checksum value may be needed to uploaded or downloaded for comparison in order to verify that the test vectors match, thereby saving a significant amount of time in the verification procedure that would normally be spent in vector download or upload.

In an exemplary embodiment of the invention, the test vectors that are to be input into the software simulator 104 and hardware emulator 108 may be broken down into functional test groups. In particular, since only checksum values are being compared, it is not possible to determine which one of the many test vectors may have failed, as may be done in standard verification procedures that compare each individual output vector. Accordingly, in the present invention, a suite of test vectors may be run at a time which, for example, test only certain limited aspects of the design. Several such test suites may need to be run to fully test the hardware design. If a particular test suite should happen to fail, that particular test suite may be rerun without using the checksum comparison method, in order to determine the exact vectors that failed. These limited numbers of output vectors may then be manually compared to determine exactly which, if any, of the vectors failed. Thus, it can be seen, that the present invention significantly reduces or eliminates manual vector comparison and also enables quickly pinpointing the point of failure in the hardware design.

Figure 3:
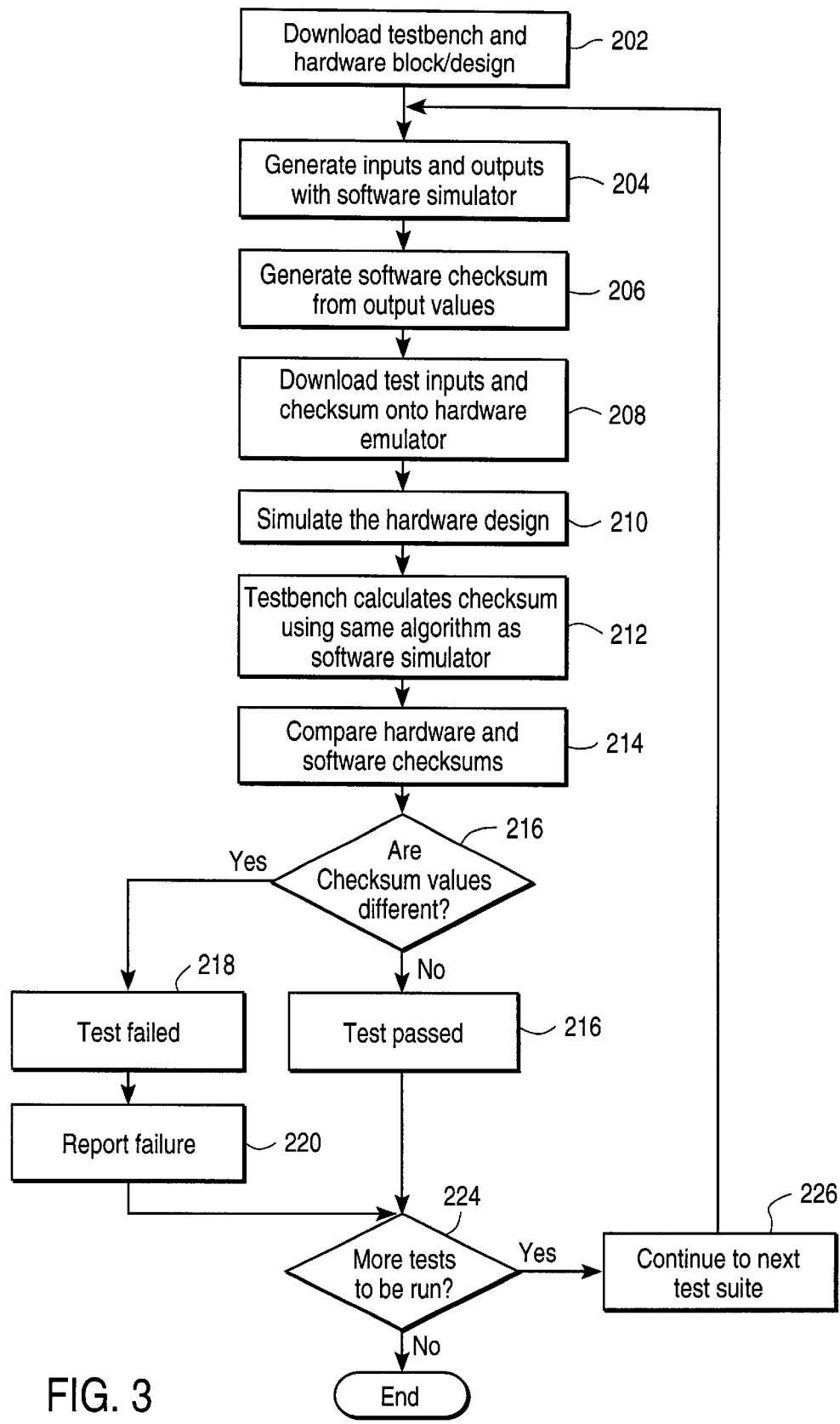
FIG. 3 is a flow diagram illustrating the vector verification system in operation in accordance with the present invention.

Referring to FIG. 3, the emulator download technique system is shown in operation. In step 202, the testbench software and hardware block/design is downloaded to the hardware emulator. In step 204, this software simulator is used to generate the input and output vectors. In step 206, the checksum calculator 106 calculates a checksum value from the output vectors. The input test vectors and the calculated checksum value is downloaded to be hardware emulator 108, in step 208. In step 210, the downloaded input vectors are used to simulate the hardware design on the hardware emulator. This simulation will result in the generation of output vectors. In step 212, the testbench will calculate the checksum all of the output vectors using the same algorithm as was used to generate the checksum in the software simulator. The testbench, in step 214, will compare the hardware and software checksums. In step 216, that testbench will determine if the checksum values are different. If it is determined that the checksum values differ, then in step 218 the test will fail. In step 220, the failure will be reported by the system for further action as may be required. However if it is determined that the checksum values are not different, then in step 222 the test will pass. In step 224 the system will determine if more tests are to be run. If not, the operation will end in step 228. However, if more tests are required to be run, the system will continue to the next test suite in step 226 and will then return to step 204.

What is claimed is:

1. A verification system, comprising:
 a software simulator for simulating a hardware design and adapted to generate one or more output vectors based on one or more predetermined input vectors;
 a hardware emulator for emulating said hardware design and adapted to generate one or more output vectors based on said one or more predetermined input vectors;
 a checksum calculator for calculating a first checksum based on said one or more software simulator output vectors and for calculating a second checksum based on said one or more hardware emulator output vectors; and
 a checksum comparator for comparing said first and said second checksums.

2. The verification system of claim 1, wherein said checksum calculator is a software algorithm.

3. The verification system of claim 1, wherein said checksum calculator is stored on said software simulator.

4. The verification system of claim 1, wherein said checksum calculator is stored on said hardware emulator.

5. The verification system of claim 1, wherein said checksum calculator is a software algorithm.

6. The verification system of claim 5, wherein said checksum calculator software algorithm is based on an additive congruential method.

7. The verification system of claim 1, wherein said input and output vectors may be grouped by one or more functions.

8. The verification system of claim 6, wherein each of said functional groups may be assigned a checksum.

9. The verification system of claim 1, wherein said checksum comparator is hardware based.

10. The verification system of claim 1, wherein said checksum comparator is software based.

11. A system for verifying the inputs and outputs of a hardware design, comprising;
 a software simulator for determining inputs and outputs in a hardware design;
 a software checksum calculator for calculating the checksum of said software simulator outputs;
 a hardware emulator for emulating said hardware design and adapted for receiving said inputs and generating outputs based on said inputs;
 a hardware checksum calculator for calculating the checksum of said hardware emulator output; and
 a checksum comparator for comparing said software simulator output checksum and said hardware emulator output.

12. In a verification system, a method for providing high speed vector verification, comprising:
 generating one or more output vectors from a first design model of a hardware system, based on one or more predetermined input vectors;
 calculating a first checksum from said first design model output vectors;
 generating one or more output vectors from a second design model of said hardware system, based on said one or more predetermined input vectors;
 calculating a second checksum from said second design model output vectors; and
 comparing said first and said second checksums.

13. The verification method of claim 12, further including downloading said first checksum value from said first design model to said second design model.

14. The verification method of claim 13, further including downloading said second checksum value from said second design model to said first design model.

15. The verification method of claim 12, further including grouping said input vectors into functional groups.

16. The verification method of claim 15 further including calculating a checksum value for each said functional group.

17. A test vector verification system, comprising:
 first means for testing a hardware design, said first means generating one or more output vectors based on one or more predetermined input vectors;
 second means for testing said hardware design, said second means generating one or more output vectors based on said one or more predetermined input vectors;
 means for calculating a first checksum based on said one or more first generating means output vectors and for calculating a second checksum based on said one or more second generating means output vectors; and
 means for comparing said first and said second checksums.

18. The test vector verification system of claim 17, wherein said comparing means includes a hardware comparator.

19. The test vector verification system of claim 17, wherein said comparing means includes a software comparator.

20. The test vector verification system of claim 17, wherein said first means includes a hardware emulator.

21. The test vector verification system of claim 17, wherein said first means includes a software simulator.

* * * * *